United States Patent
Sim et al.

(10) Patent No.: US 9,558,987 B2
(45) Date of Patent: Jan. 31, 2017

(54) GAP-FILL METHODS

(71) Applicants: Rohm and Haas Electronic Materials LLC, Marlborough, MA (US); Dow Global Technologies LLC, Midland, MI (US); Rohm and Haas Electronic Materials Korea Ltd., Chungcheon-do (KR)

(72) Inventors: Jae Hwan Sim, Kyonggi-do (KR); Jin Hong Park, Busan (KR); Jae-Bong Lim, Chung-Nam (KR); Jung Kyu Jo, Ulsan (KR); Cheng-Bai Xu, Southborough, MA (US); Jong Keun Park, Westborough, MA (US); Mingqi Li, Shrewsbury, MA (US); Phillip D. Hustad, Natick, MA (US)

(73) Assignees: Dow Global Technologies LLC, Midland, MI (US); Rohm and Haas Electronic Materials LLC, Marlborough, MA (US); Rohm and Haas Electronic Materials Korea Ltd. (KR)

( * ) Notice: Subject to any disclaimer, the term of this patent is extended or adjusted under 35 U.S.C. 154(b) by 0 days.

(21) Appl. No.: 14/582,149

(22) Filed: Dec. 23, 2014

(65) Prior Publication Data
US 2015/0348828 A1 Dec. 3, 2015

Related U.S. Application Data

(60) Provisional application No. 61/920,344, filed on Dec. 23, 2013.

(51) Int. Cl.
*H01L 21/31* (2006.01)
*H01L 21/762* (2006.01)
*H01L 21/3105* (2006.01)

(52) U.S. Cl.
CPC ... *H01L 21/76224* (2013.01); *H01L 21/31058* (2013.01)

(58) Field of Classification Search
CPC .................. H01L 21/76224; H01L 21/31058
(Continued)

(56) References Cited

U.S. PATENT DOCUMENTS

| 5,854,112 A | 12/1998 | Krautschneider et al. |
| 6,461,717 B1 | 10/2002 | Rutter, Jr. et al. |

(Continued)

FOREIGN PATENT DOCUMENTS

| EP | 1398831 A2 | 3/2004 |
| JP | 2010-026221 A | 2/2010 |
| JP | 2010026221 A | 2/2010 |

OTHER PUBLICATIONS

Search Report for corresponding Taiwan Application No. 103144924 dated Oct. 5, 2015.

*Primary Examiner* — Bradley K Smith
(74) *Attorney, Agent, or Firm* — Jonathan D. Baskin (57) ABSTRACT

Gap-fill methods comprise: (a) providing a semiconductor substrate having a relief image on a surface of the substrate, the relief image comprising a plurality of gaps to be filled; (b) applying a gap-fill composition over the relief image, wherein the gap-fill composition comprises a non-cross-linked crosslinkable polymer, an acid catalyst, a crosslinker and a solvent, wherein the crosslinkable polymer comprises a first unit of the following general formula (I):

(Continued)

wherein: $R_1$ is chosen from hydrogen, fluorine, $C_1$-$C_3$ alkyl and $C_1$-$C_3$ fluoroalkyl; and $Ar_1$ is an optionally substituted aryl group that is free of crosslinkable groups; and a second unit of the following general formula (II):

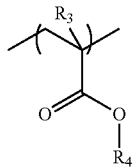

(II)

wherein: $R_3$ is chosen from hydrogen, fluorine, $C_1$-$C_3$ alkyl and $C_1$-$C_3$ fluoroalkyl; and $R_4$ is chosen from optionally substituted $C_1$ to $C_{12}$ linear, branched or cyclic alkyl, and optionally substituted $C_6$ to $C_{15}$ aryl, optionally containing heteroatoms, wherein at least one hydrogen atom is substituted with a functional group independently chosen from hydroxyl, carboxyl, thiol, amine, epoxy, alkoxy, amide and vinyl groups; and (c) heating the gap-fill composition at a temperature to cause the polymer to crosslink. The methods find particular applicability in the manufacture of semiconductor devices for the filling of high aspect ratio gaps.

18 Claims, 4 Drawing Sheets

(58) Field of Classification Search
USPC .......................................................... 438/781
See application file for complete search history.

(56) References Cited

U.S. PATENT DOCUMENTS

| | | |
|---|---|---|
| 6,749,765 B2 | 6/2004 | Rutter, Jr. et al. |
| 7,361,718 B2 | 4/2008 | Takei et al. |
| 7,517,633 B2 | 4/2009 | Takei et al. |
| 8,007,979 B2 | 8/2011 | Takei et al. |
| 8,906,253 B2 | 12/2014 | Yamamoto |
| 2006/0068526 A1* | 3/2006 | Takei ..................... G03F 7/094 438/127 |
| 2006/0275696 A1 | 12/2006 | Zampini et al. |
| 2007/0057253 A1* | 3/2007 | Gronbeck ............. G03F 7/0752 257/40 |
| 2008/0102649 A1* | 5/2008 | Takei ..................... G03F 7/094 438/781 |

* cited by examiner

GAP-FILL METHODS

This application claims the benefit of priority under 35 U.S.C. §119(e) to U.S. Provisional Application No. 61/920,344, filed Dec. 23, 2013, the entire contents of which are incorporated herein by reference.

FIELD

The invention relates generally to the manufacture of electronic devices. More specifically, this invention relates to gap-fill methods having applicability to semiconductor device manufacturing. The methods find particular use in the filling of gaps such as trenches for device isolation.

INTRODUCTION

In the semiconductor manufacturing industry, large numbers of electronic devices are fabricated on a semiconductor substrate. With higher integration densities that occur with each new design node, devices become packed together using smaller and smaller geometries with reduced spacing between them. As a result, aspect ratios are also increasing, bringing about various process challenges.

One such challenge exists for gap-fill processes in which a gap, for example, a trench, hole or spacing between lines, is filled with a material for planarization, isolation or other purpose. As an example of a gap-fill process, shallow trench isolation (STI) is used to prevent current leakage between adjacent transistors resulting from the small geometries and spacing between devices. An STI process is described, for example, in U.S. Pat. No. 5,854,112A. In this process, trench structures are formed by first imaging trench patterns in a photoresist layer. The photoresist pattern is then transferred to the underlying substrate, for example, the substrate silicon or other layer(s) on the substrate, typically by anisotropic dry-etching. The trenches are then filled with a dielectric material such as a silicon oxide using, for example, a chemical vapor deposition (CVD) or spin-on glass (SOG) process. Excess dielectric material is typically removed using chemical mechanical planarization (CMP).

As devices approach sub-20 nanometer geometries, features such as trenches, holes and other gaps typically have high aspect ratios. Such high aspect ratio features can be difficult to fill using the conventional approaches without also creating a significant amount of voids. The presence of voids can give rise to various problems that can adversely impact device reliability and/or cause defects. In the case of the STI process, for example, void formation can result in poor electrical isolation, resulting in current leakage between adjacent devices. To avoid defects in the formed devices, it is desirable that the gaps be filled in a void-free manner. This, however, can be difficult given the reduced dimensions and constraints on the gap-fill materials and process conditions.

There is a continuing need in the semiconductor manufacturing industry for improved methods which are useful in the filling of gaps including those having high aspect ratios.

SUMMARY

In accordance with a first aspect of the invention, gap-fill methods are provided. The methods comprise: (a) providing a semiconductor substrate having a relief image on a surface of the substrate, the relief image comprising a plurality of gaps to be filled; (b) applying a gap-fill composition over the relief image, wherein the gap-fill composition comprises a non-crosslinked crosslinkable polymer, an acid catalyst, a crosslinker and a solvent, wherein the crosslinkable polymer comprises a first unit of the following general formula (I):

(I)

wherein: $R_1$ is chosen from hydrogen, fluorine, $C_1$-$C_3$ alkyl and $C_1$-$C_3$ fluoroalkyl; and $Ar_1$ is an optionally substituted aryl group that is free of crosslinkable groups; and a second unit of the following general formula (II):

(II)

wherein: $R_3$ is chosen from hydrogen, fluorine, $C_1$-$C_3$ alkyl and $C_1$-$C_3$ fluoroalkyl; and $R_4$ is chosen from optionally substituted $C_1$ to $C_{12}$ linear, branched or cyclic alkyl, and optionally substituted $C_6$ to $C_{15}$ aryl, optionally containing heteroatoms, wherein at least one hydrogen atom is substituted with a functional group independently chosen from hydroxyl, carboxyl, thiol, amine, epoxy, alkoxy, amide and vinyl groups; and (c) heating the gap-fill composition at a temperature to cause the polymer to crosslink. The methods find particular applicability in the manufacture of semiconductor devices for the filling of high aspect ratio gaps.

The terminology used herein is for the purpose of describing particular embodiments only and is not intended to be limiting of the invention. As used herein, the singular forms "a", "an" and "the" are intended to include the plural forms as well, unless the context clearly indicates otherwise.

BRIEF DESCRIPTION OF THE DRAWINGS

The present invention will be described with reference to the following drawings, in which like reference numerals denote like features, and in which.

DETAILED DESCRIPTION

The gap-fill methods of the invention involve application of a gap-fill composition over a relief image on a surface of the substrate. The gap-fill compositions include a non-crosslinked crosslinkable polymer, an acid catalyst, a crosslinker and a solvent, and may include one or more additional optional components.

The non-crosslinked crosslinkable polymer (also referred to herein as crosslinkable polymer) contains a first unit of the following general formula (I):

(I)

wherein $R_1$ is chosen from hydrogen, fluorine, $C_1$-$C_3$ alkyl and $C_1$-$C_3$ fluoroalkyl, with hydrogen being typical; and $Ar_1$ is an optionally substituted aryl group. Preferably, $Ar_1$ include 1, 2 or 3 aromatic carbocyclic and/or heteroaromatic rings. It is preferred that the aryl group comprises a single aromatic ring, and more preferably a phenyl ring. Where multiple aromatic rings are present, the rings can be fused, for example, naphthyl or anthracenyl. The aryl group is optionally substituted, for example, with halogen, nitro, cyano, optionally substituted $C_1$-$C_{15}$ linear, branched or cyclic alkyl, for example, fluorinated or nonfluorinated butyl, isobutyl, hexyl, decyl, cyclohexyl, adamantly and norbonyl, alkenyl, alkynyl, $C_6$-$C_{18}$ aryl, for example, benzyl, phenyl, naphthyl or anthracyl, and combinations thereof. $Ar_1$ is free of crosslinkable groups including, for example, hydroxyl groups.

Preferred for the first unit of general formula (I) is a unit chosen from the following formula (I-A), (I-B) and (I-C):

(I-A)

(I-B)

(I-C)

wherein: $R_1$ is chosen from hydrogen, fluorine, $C_1$-$C_3$ alkyl and $C_1$-$C_3$ fluoroalkyl, with hydrogen being typical; $R_2$ is independently chosen from halogen, nitro, cyano, and optionally substituted $C_1$-$C_{15}$ linear, branched or cyclic alkyl, for example, fluorinated or nonfluorinated butyl, isobutyl, hexyl, decyl, cyclohexyl, adamantly and norbonyl, alkenyl, alkynyl, $C_6$-$C_{18}$ aryl, for example, benzyl, phenyl, naphthyl and anthracenyl, and combinations thereof, with hydrogen being typical, and $R_2$ is free of crosslinkable groups, for example, hydroxyl groups; a is an integer from 0 to 5, typically 0 or 1; b is an integer from 0 to 7, typically 0 to 2, or 0 or 1; and c is an integer from 0 to 9, typically 0 to 3, or 0 or 1. The first unit can be useful for purposes of tuning surface energy, optical properties (e.g., n and k values) and/or glass transition temperature of the non-crosslinked crosslinkable polymer.

Suitable structures for the first unit include, for example, the following:

Of these structures, styrene is preferable. The first unit is typically present in the non-crosslinked crosslinkable polymer in an amount of from 30 to 99 mol %, preferably from 80 to 98 mol % based on the polymer.

The non-crosslinked crosslinkable polymer includes a second unit of the following general formula (II):

(II)

wherein: $R_3$ is chosen from hydrogen, fluorine, $C_1$-$C_3$ alkyl and $C_1$-$C_3$ fluoroalkyl; and $R_4$ is chosen from: optionally substituted $C_1$ to $C_{12}$ linear, branched or cyclic alkyl; and optionally substituted $C_6$ to $C_{15}$ aryl (e.g. phenyl, napthyl, anthracenyl), optionally containing heteroatoms; wherein at least one hydrogen atom is substituted with a functional group independently chosen from hydroxyl, carboxyl, thiol, amine, epoxy, alkoxy, amide and vinyl groups. Of these, hydroxyl is preferred. Positions on $R_4$ for the functional groups are not limited and can be, for example, on a primary, secondary or tertiary position. In the case, for example, of a hydroxyl group, a primary, secondary or tertiary alcohol can be used.

Suitable structures for the second unit include, for example, the following:

The second unit is typically present in the crosslinkable polymer in an amount of from 1 to 70 mol %, for example, from 1 to 50 mol %, from 1 to 20 mol %, or from 1 to 10 mol %, based on the polymer. If the content of the first unit relative to the second unit is too low, it is believed that the gap-filling capability for small, high aspect ratio gaps may worsen, and if too high, polymer swelling and strip resistance may worsen due to insufficient crosslinking.

In one aspect, the repeat units of the non-crosslinked crosslinkable polymer include only units of general formula (I) and general formula (II), i.e., the polymer consists of units of general formula (I) and general formula (II). In this case, the non-crosslinked crosslinkable polymer can be made up of a single type of unit of general formula (I) and a single type of unit of general formula (II). Alternatively, the crosslinkable polymer can include different types of units of general formula (I) and/or different types of units of general formula (II).

In another aspect, the non-crosslinked crosslinkable polymer can include one or more additional units other than those of general formulae (I) and (II). The polymer can, for example, include one or more additional units for purposes of adjusting properties of the gap-fill composition, for example, etch rate and solubility. Suitable additional units include, for example, one or more units chosen from (meth) acrylate for solubility, vinyl ether, vinyl ketone and vinyl ester for faster etch, preferably without crosslinkable groups on the sidechain.

Suitable additional units include, for example, the following:

The one or more additional units if present in the non-crosslinked crosslinkable polymer can be used in an amount of up to 69 mol %, preferably from 5 to 50 mol % based on the polymer.

Because the crosslinkable polymer is non-crosslinked in the composition, it can more effectively fill small dimensioned high aspect ratio gaps such as holes, trenches and spaces between lines and other features. This is believed to be a result of lower molecular weight and volume as compared with crosslinked materials.

The non-crosslinked crosslinkable polymer preferably exhibits hydrophobic characteristics similar to polystyrene. Without wishing to be bound by any particular theory, it is believed that hydrophobic polymers have a relatively inert nature on interaction with various surfaces of the substrate. In contrast, hydrophilic groups such as hydroxyl and carboxyl typically interact with the substrate surfaces covalently or non-covalently. Such interaction with the surfaces by hydrophilic groups is believed to inhibit effective gap-filling of the compositions during the coating process. The degree of hydrophobicity can be determined by Gradient Polymer Elution Chromatography (GPEC). Preferable gap-fill compositions of the invention have a retention time of the maximum peak within 90% of that for polystyrene according to GPEC analysis.

The non-crosslinked crosslinkable polymer typically has a weight average molecular weight Mw of greater than 6000, for example, from 6000 to 30,000, preferably greater than 8000, greater than 9000 or greater than 10,000, with greater than 8000 to less than 20,000, from 9000 to 18,000 and from 10,000 to 15,000 being typical. Preferable molecular weights will allow for reasonable yields during synthesis and low swelling/high stripping resistance to solvents with which the gap-fill compositions come into contact in use, for example, solvents used in bottom antireflective coating (BARC), photoresist and developer materials. High swelling/low stripping resistance can result in pattern collapse during patterning of the overcoated photoresist.

The polydispersity index (PDI) of the non-crosslinked crosslinkable polymer is not particularly limited. Typically, the crosslinkable polymer has a polydispersity index (PDI) of 1.05 or more, typically from 1.05 to 2.0.

Preferably, the glass transition temperature ($T_g$) of the non-crosslinked crosslinkable polymer is 10 C.° or more lower than the onset temperature ($T_o$) for crosslinking of the polymer, preferably 15 C.° or more, 20 C.° or more or 30 C.° or more lower than the onset temperature for crosslinking of the polymer. As referenced herein, the glass transition temperature is as determined by differential scanning calorimetry (DSC, rate of increase of 20° C./min). This temperature difference between onset temperature and glass transition temperature is defined by the following formula:

$$\Delta T_{o-g} = T_o - T_g.$$

By selection of a crosslinkable polymer having a sufficiently high $\Delta T_{o-g}$, premature crosslinking of the polymer can be avoided when the composition is heated, for example, during softbake and during optional gap-fill bake processes described below. In addition, gap-fill compositions in accordance with the invention containing a non-crosslinked crosslinkable polymer having sufficiently high $\Delta T_{o-g}$ typically have very good planarization. The non-crosslinked crosslinkable polymer is typically present in the gap-fill composition in an amount of from 60 to 95 wt %, for example, from 85 to 95 wt % or from 90 to 95 wt %, based on total solids of the composition.

Suitable crosslinkable polymers for use in the methods of the invention include, for example, the following:

(P-1)

(P-2)

-continued

(P-3)

(P-4)

(P-5)

(P-6)

(P-7)

(P-8)

(P-9)

(P-10)

(P-11)

(P-12)

(P-13)

(P-14)

(P-15)

(P-16)

(P-17)

(P-18)

Crosslinkers useful in the present invention are any which can undergo acid catalyzed crosslinking with the crosslinkable polymers. Suitable crosslinkers include, for example, di-, tri-, tetra-, or higher multi-functional ethylenically unsaturated monomers. Crosslinkers useful in the present invention include, for example: trivinylbenzene, divinyltoluene; divinylpyridine, divinylnaphthalene, divinylxylene, ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DE-

GDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol diacrylate, tetraethylene glycol dimethacrylate, polyethylene glycol dimethacrylate, ethoxylated bisphenol A diacrylate, ethoxylated bisphenol A dimethacrylate, polyethylene glycol dimethacrylate, poly(butanediol)diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly (phenyl vinyl siloxane), tetra($C_1$-$C_8$) alkoxyglycoluril such as tetramethoxyglycoluril and tetrabutoxyglycoluril, and combinations thereof. Preferably, the crosslinker is a tetra-alkoxyalkyl glycouril, a hexamethylol melamine or an aromatic compound having multi-functional groups suitable for acid catalyzed crosslinking. Suitable crosslinkers are commercially available. The crosslinker is typically present in an amount of from 4 to 25 wt %, for example, from 10 to 22 wt % based on the total solids of the composition.

Acid catalysts useful in the present invention include free acids and acid generators. Any free acid which is compatible with the compositions of the present invention and catalyzes crosslinking of the polymer and crosslinker is suitable for use in the present invention. Examples of free acids include, but are not limited to, sulfonic acids such as methane sulfonic acid, ethane sulfonic acid, propyl sulfonic acid, phenyl sulfonic acid, toluene sulfonic acid, dodecylbenzene sulfonic acid, and trifluoromethyl sulfonic acid.

Suitable acid generators include thermal acid generators (TAGs), photoacid generators (PAGs) and combinations thereof. A thermal acid generator is a compound which is capable of generating an acidic moiety when heated. The thermal acid generator can be nonionic or ionic. Suitable nonionic thermal acid generators include, for example, cyclohexyl p-toluenesulfonate, methyl p-toluenesulfonate, cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, alkyl esters of organic sulfonic acids such as p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and combinations thereof. Suitable ionic thermal acid generators include, for example, dodecylbenzenesulfonic acid triethylamine salts, dodecylbenzenedisulfonic acid triethylamine salts, p-toluene sulfonic acid-ammonium salts, sulfonate salts, such as carbocyclic aryl (e.g., phenyl, napthyl, anthracenyl, etc.) and heteroaryl (e.g., thienyl) sulfonate salts, aliphatic sulfonate salts and benzenesulfonate salts. Compounds that generate a sulfonic acid upon activation are generally suitable. Preferred thermal acid generators include p-toluenesulfonic acid ammonium salts.

A photoacid generator is a compound which is capable of generating an acidic moiety when exposed to activating radiation. Suitable photoacid generators include, for example, sulfide and onium type compounds. Photoacid generators include but are not limited to diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, (4-tbutylphenyl) tetramethylenesulfonium (3-hydroxyadamantanyl ester)-tetrafluoro-butanesulfonate), (4-tbutylphenyl) tetramethylenesulfonium (adamantanyl ester)-tetrafluoro-butanesulfonate) and dibutylnaphthylsulfonium triflate. Preferred PAGs include tetramethylenesulfonium compounds.

Certain photoacid generators can also function as thermal acid generators, generating an acid upon exposure to activating radiation or heat. The following compounds, for example, can function as a PAG or TAG:

When used as a TAG, these compounds provide relatively slow crosslinking (high crosslinking onset temperature) as compared with ammonium salts so that high $\Delta T_{o-g}$ can be realized.

A combination of acid catalysts can be used in the present invention. Suitable combinations include, for example, a free acid with a photoacid generator, a free acid with a thermal acid generator or a thermal acid generator with a photoacid generator.

Suitable acid catalysts are commercially available. The acid catalyst is typically present in the composition in an amount of from 0.1 to 8 wt %, preferably from about 0.5 to about 5 wt %, based on the total solids of the composition.

The gap-fill composition further includes a solvent which can include a single solvent or a solvent mixture. Suitable solvent materials to formulate and cast the gap-fill composition exhibit very good solubility characteristics with respect to the non-solvent components of the gap-fill composition, but do not appreciably dissolve the underlying relief image or other materials of the substrate surface coming into contact with the gap-fill composition. The solvent is typically chosen from water, aqueous solutions, organic solvents and mixtures thereof. The solvent is preferably an organic solvent. Suitable organic solvents for the gap-fill composition include, for example: alcohols such as straight, branched or cyclic $C_4$-$C_9$ monohydric alcohol such as 1-butanol, 2-butanol, isobutyl alcohol, tert-butyl alcohol, 2-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; esters-based solvents such as alkyl acetates such as n-butyl acetate, propionates such as n-butyl propionate, n-pentyl propionate, n-hexyl propionate and n-heptyl propionate, and alkyl butyrates such as n-butyl butyrate, isobutyl butyrate and isobutyl isobutyrate, diethyl carbonate, methyl acetate, ethyl acetate, gamma-butyrolactone, gamma-valerolactone, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, 2-hydroxyisobutyric acid methyl ester and the like; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; ethers such as isopentyl ether and dipropylene glycol monomethyl ether; and mixtures containing one or more of these solvents. Of these solvents, propylene glycol monomethyl ether acetate, gamma-butyrolactone, 2-hydroxyisobutyric acid methyl ester and their combinations are preferred. The solvent component of the gap-fill composition is typically present in an amount of from 80 to 99 wt %, more typically, from 90 to 99 wt % or from 95 to 99 wt %, based on the total weight of the gap-fill composition.

The gap-fill composition may include one or more optional additives including, for example, surfactants and antioxidants. Such optional additives if used are each typically present in the composition in minor amounts such as from 0.01 to 10 wt % based on total solids of the gap-fill composition.

Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON™ X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL™ and DYNOL™. Additional suitable surfactants include other polymeric compounds such as the tri-block EO-PO-EO co-polymers PLURONIC™ 25R2, L121, L123, L31, L81, L101 and P123 (BASF, Inc.).

An antioxidant can be added to prevent or minimize oxidation of organic materials in the gap-fill composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl.hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butyl.anilino)2,4-bis.octyl-thio-1, 3,5-triazine, n-octadecyl-3-(4'-hydroxy-3',5'-di-tert-butyl-.phenyl)propionate, octylated phenol, aralkyl-substituted phenols, alkylated p-cresol and hindered phenol; bis-, tris- and poly-phenols such as 4,4'-dihydroxy.diphenyl, methylene.bis(dimethyl-4,6-phenol), 2,2'-methylene-bis-(4-methyl-6-tert-butylphenol), 2,2'-methylene-bis-(4-methyl-6-cyclohexyl.phenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl.diphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane. Suitable antioxidants are commercially available, for example, Irganox™ antioxidants (Ciba Specialty Chemicals Corp.).

The gap-fill compositions can be prepared following known procedures. For example, the compositions can be prepared by dissolving the solid components of the composition in the solvent components. The desired total solids content of the compositions will depend on factors such as the desired final layer thickness. Typically, the solids content of the gap-fill compositions is from 1 to 20 wt %, for example, from 1 to 10 wt %, more typically, from 1 to 5 wt %, based on the total weight of the composition.

Figure 1A:
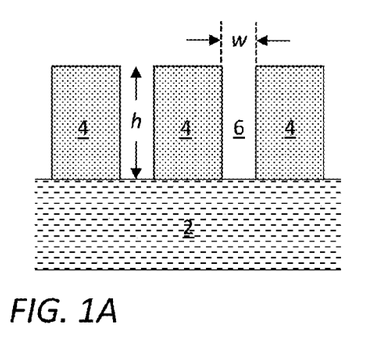
FIG. 1A-D illustrates a first gap-fill process flow in accordance with the invention.

Methods of the invention in accordance with a first aspect will now be described with reference to FIG. 1A-D. FIG. 1A depicts in cross-section a semiconductor substrate 2. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon, and may have one or more layers and patterned features formed on a surface thereof. Layers forming part of the substrate may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers such as single-crystal silicon, carbon layers and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, electroplating, or a liquid coating technique such as spin-coating.

The uppermost layer of the substrate includes a relief image 4 that defines gaps 6 to be filled. The gaps to be filled may be present in the base substrate material itself or in a layer formed over the base substrate material and can take various forms. The gaps can, for example, take the form of trenches or holes and, advantageously can be extremely narrow in width and having high aspect ratios.

The relief image typically is formed by a lithographic process, for example, a photolithographic or assembly process such as directed assembly (DSA). An etching process such as an anisotropic dry etch is typically used for pattern transfer to an underlying layer from which the relief image and gaps are formed. The gaps can take the form, for example, of holes, trenches or spaces between lines or other features. In the illustrated embodiment, the gaps extend completely through the material layer from which the relief image is formed, exposing the underlying substrate. It may be desirable that the gaps extend only partially through the material layer. In the case of a photolithography process, it is preferable to use an exposure radiation less than 300 nm in wavelength such as 248 nm, 193 nm or an EUV wavelength (e.g., 13.4 or 13.5 nm), or electron beam exposure. The gaps can take the form, for example, of trenches or holes having a height h and a width w, and can be of relatively narrow width and large height. Processes and compositions in accordance with the invention are suitable for use in the filling of gaps having relatively high aspect ratios. As used herein, aspect ratio (AR) is defined as AR=h/w, wherein h is the gap height and w is the gap width. Typically, the gap width is from 1 nm to 200 nm, for example, 1 nm to 100 nm, 1 nm to 50 nm, 1 nm to 25 nm or from 1 to 10 nm, and is preferably less than 50 nm, for example, less than 20 nm, less than 15 nm, less than 10 nm or less than 5 nm. The aspect ratio is typically from 1 to 20, for example, from 2 to 20 or from 5 to 20.

Figure 1B:
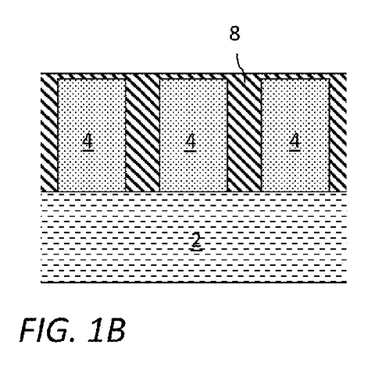

As shown in FIG. 1B, a gap-fill composition 8 as describe herein is applied to the wafer surface over the relief image 4. The gap-fill composition can be applied to the substrate by spin-coating, dipping, roller-coating or other conventional coating technique. Of these, spin-coating is typical and preferred. For spin-coating, the solids content of the gap-fill composition can be adjusted to provide a desired film thickness based upon the specific coating equipment utilized, the viscosity of the solution, the speed of the coating tool and the amount of time allowed for spinning. The desired coated thickness of the gap-fill composition will depend, for example, on the geometry of the gaps to be filled. A typical thickness for the gap-fill composition 8 is from about 200 to 3000 Å.

The gap-fill composition is typically next softbaked at a temperature and time to evaporate residual solvent from the layer. The softbake temperature is lower than the onset temperature to avoid premature crosslinking of the polymer. The softbake can be conducted with a hotplate or oven, with a hotplate being typical. The softbake can, for example, be conducted on a hotplate of a wafer track also used for coating of the gap-fill composition. The softbake temperature and time will depend, for example, on the particular composition and thickness of the gap-fill composition. The softbake is typically conducted at a temperature of from about 70 to 150° C., and a time of from about 30 to 90 seconds.

Figure 1C:
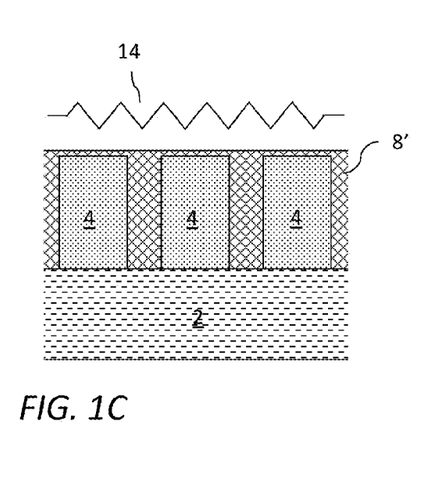

With reference to FIG. 1C, the composition is next heated at a temperature and time to cause the crosslinkable polymer to crosslink, thereby forming a crosslinked polymer 8'. The crosslinking bake can be conducted on a hotplate or in an oven 14, with a hotplate being typical. The crosslinking bake can, for example, be conducted on a hotplate of a wafer track also used for coating of the gap-fill composition. The crosslinking bake temperature and time will depend, for example, on the particular composition and thickness of the softbaked gap-fill composition. The crosslinking bake is typically conducted at a temperature of from about 150 to 300° C., and a time of from about 30 seconds to 3 minutes. The crosslinking bake can be conducted, for example, by heating the gap-fill composition at a single temperature or by ramping the temperature. The softbake and crosslinking bake can be conducted in a single process using the same heater, for example, by ramping the temperature from softbaking to crosslinking temperature.

Figure 1D:
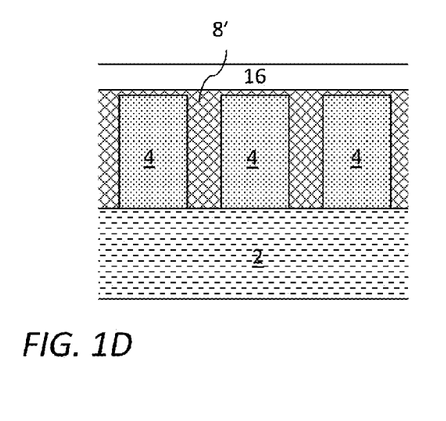

Following crosslinking of the gap-fill composition, further processing of the substrate is conducted to form a final device, which can include a memory (e.g., DRAM) or logic device. The further processing can include, for example, one or more of formation of a layer 16 over the substrate as shown in FIG. 1D, polishing, chemical-mechanical planarization (CMP), ion implantation, annealing, CVD, PVD, epitaxial growth, electroplating and lithographic techniques such as DSA and photolithography. Advantageously, coating of a liquid layer containing a solvent, for example, by spin-coating, directly over the crosslinked gap-fill composition, can be conducted without intermixing with the underlying crosslinked material.

Figure 2A:
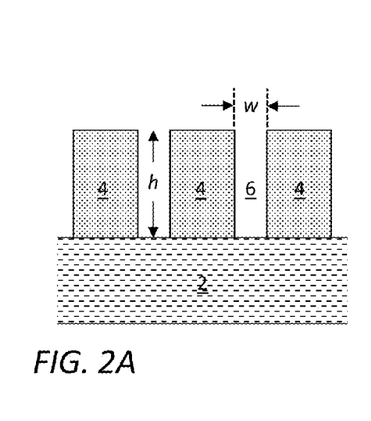
FIG. 2A-F illustrates a second gap-fill process flow in accordance with the invention.
Figure 2B:
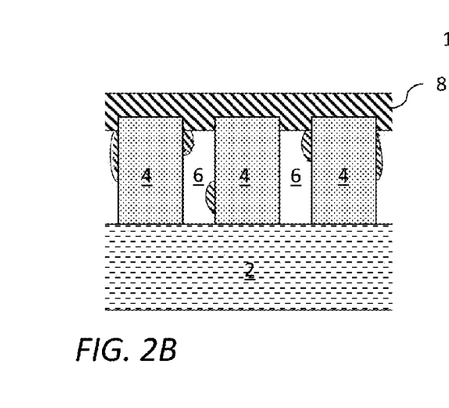
Figure 2C:
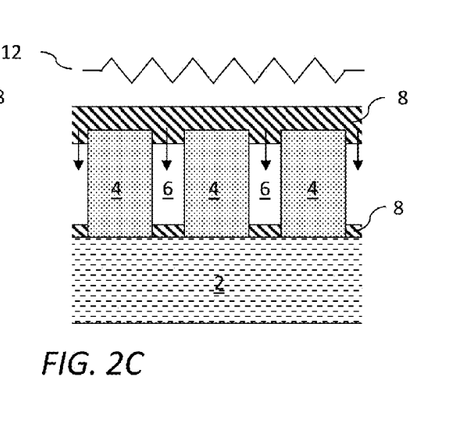
Figure 2D:
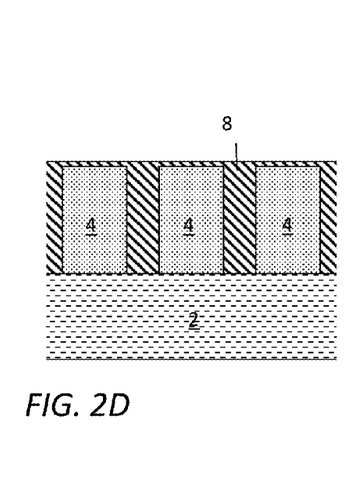

FIG. 2A-F illustrates a method in accordance with a further aspect of the invention, wherein application of the gap-fill composition 8 to the wafer 2 does not completely fill the gaps, as shown in FIG. 2B. This can occur, for example, for very fine gaps, high viscosity gap-fill compositions and/or higher molecular weight crosslinkable polymers. Depending on the softbake temperature, gap-fill composition and gap dimensions and geometry, partial or complete gap-filling may occur during softbake if the polymer viscosity is sufficiently reduced. Except as otherwise indicated, the description above with respect to the process shown in FIG. 1 applies also to the process described with reference to FIG. 2.

Where gap-filling is incomplete following coating and soft-bake, the softbaked gap-fill composition can be heated in a gap-fill bake at a temperature that is greater than the softbake temperature and for a time effective to cause the gap-fill composition to fill the plurality of gaps. As shown in FIG. 2C, the gap-fill bake can be conducted with a hotplate or oven 12, with a hotplate being typical. The gap-fill bake can, for example, be conducted on a hotplate of a wafer track also used for coating of the gap-fill composition and soft-bake. The gap-fill bake temperature and time will depend, for example, on the particular composition and thickness of the softbaked gap-fill composition. The gap-fill bake is typically conducted at a temperature of from about 150 to 200° C., and a time of from about 30 seconds to 10 minutes. Preferably, the gap-fill bake temperature is 10 C.° or more lower than the onset temperature, preferably 20 C.° or more or 30 C.° or more lower than the onset temperature of the composition. Preferably, the gap-fill bake temperature is 15 C.° or more lower than the crosslinking bake temperature, preferably 25 C.° or more or 35 C.° or more lower than the crosslinking bake temperature. During the gap-fill bake process, the viscosity of the softbaked gap-fill composition 8 becomes lower, allowing the material to fill gaps 6, as shown in FIGS. 2C and 2D.

Figure 2E:
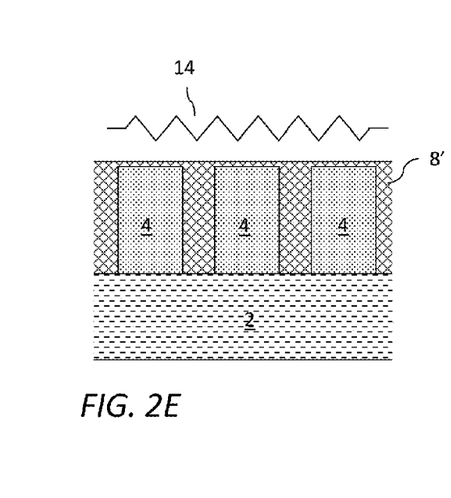
Figure 2F:
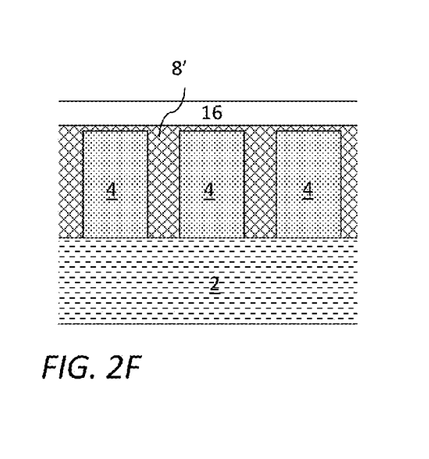

With reference to FIG. 2E, the composition is next heated at a temperature that is greater than the temperature of the gap-fill bake to cause the non-crosslinked crosslinkable polymer to crosslink. The crosslinking bake can be conducted on a hotplate or in an oven 14, with a hotplate being typical. The crosslinking bake can, for example, be conducted on a hotplate of a wafer track also used for coating of the gap-fill composition. The crosslinking bake temperature and time will depend, for example, on the particular composition and thickness of the softbaked gap-fill composition. The crosslinking bake is typically conducted at a temperature of from about 200 to 300° C., and a time of from about 30 seconds to 30 minutes. Optionally, the gap-fill bake and crosslinking bake can be conducted in a single process. The gap-fill and crosslinking bake can, for example, be conducted sequentially using the same heating tool. The heating can be conducted, for example, by continuously ramping the temperature or using a terraced temperature profile to perform both gap-fill and crosslinking baking functions. Following the gap-fill process, further processing is conducted to form the final device.

The following non-limiting examples are illustrative of the invention.

EXAMPLES

Example 1

Synthesis of Poly(styrene-co-HEMA)

A polymer feed solution was prepared by combining 48.14 g styrene monomer (liquid) and 1.86 g 2-hydroxyethyl methacrylate monomer (liquid) in a 100 ml glass bottle. The bottle was shaken slightly to mix the monomers, and was placed in an ice bath to allow the temperature of the monomer mixture to reach equilibrium with the ice bath. 1.373 g of V601 azo initiator (white powder, Wako Pure Chemical Industries, Ltd.) was added into the bottle and the bottle was shaken to completely dissolve the initiator. The bottle was returned to the ice bath. 50 g of 1-butanol was charged into a three-neck 250 ml round bottom flask equipped with a thermal controller, and the flask was purged with nitrogen. A three-neck 250 ml round bottom flask containing reaction mixture was heated until the temperature of the reaction mixture reached 80° C. The monomer feed solution was fed into the reactor at a rate of 0.92 ml/min for a total feeding time of ~60 minutes. The reactor was maintained at 80° C. for one additional hour after completion of monomer feeding. Heating was stopped and the reactor was allowed to cool down to room temperature with stirring. The resulting polymer solution was precipitated with methyl alcohol (10× excess of reaction mixture), filtered and vacuum dried.

Example 2

Synthesis of Poly(styrene-co-HDMA)

A polymer feed solution was prepared by combining 39.79 g styrene monomer (liquid) and 10.21 g 2-hydroxydecyl methacrylate monomer (liquid) in a 100 ml glass bottle. The bottle was shaken slightly to mix the monomers, and was placed in an ice bath to allow the temperature of the monomer mixture to reach equilibrium with the ice bath. 1.957 g of V601 azo initiator (white powder, Wako Pure Chemical Industries, Ltd.) was added into the bottle and the bottle was shaken to completely dissolve the initiator. The bottle was returned to the ice bath. 50 g of 1-butanol was charged into a three-neck 250 ml round bottom flask equipped with a thermal controller, and the flask was purged with nitrogen. A three-neck 250 ml round bottom flask containing reaction mixture was heated until the temperature of the reaction mixture reached 80° C. The monomer feed solution was fed into the reactor at a rate of 0.83 ml/min for a total feeding time of ~60 minutes. The reactor was maintained at 80° C. for one additional hour after completion of monomer feeding. Heating was stopped and the reactor was allowed to cool down to room temperature with stirring. The resulting polymer solution was precipitated with methyl alcohol (10× excess of reaction mixture), filtered and vacuum dried.

Example 3

Gap-Fill Composition 1

1.07 g of tetramethoxymethyl glycouril, 0.057 g of p-toluene sulfonic acid (p-TSA) ammonium salt (T-1), 0.0036 g fluorochemical surfactant and 108.8 g of propylene glycol monomethyl ether acetate (PGMEA) was added to 60 g of a PGMEA solution containing the 10 wt % of PS-HEMA polymer of Example 1 to obtain a 4.2 wt % solution, based on total weight of the composition. The solution was filtered through a PTFE micro filter with 0.45 micron pore size to obtain Gap-Fill Composition 1.

Example 4

Gap-Fill Composition 2

1.07 g of tetramethoxymethyl glycouril, 0.057 g of p-TSA ammonium salt (T-1), 0.0036 g fluorochemical surfactant and 108.8 g of propylene glycol monomethyl ether acetate (PGMEA) was added to 60 g of a PGMEA solution containing the 10 wt % of PS-HDMA polymer of Example 2 to obtain a 4.2 wt % solution, based on total weight of the composition. The solution was filtered through a PTFE micro filter with 0.45 micron pore size to obtain Gap-Fill Composition 2.

Example 5

Gap-Fill Composition 3

1.07 g of tetramethoxymethyl glycouril, 0.07 g of tetramethylenesulfonium salt (T-2), 0.0036 g fluorochemical surfactant and 108.8 g of propylene glycol monomethyl ether acetate (PGMEA) was added to 60 g of a PGMEA solution containing the 10 wt % of PS-HEMA polymer of Example 1 to obtain a 4.2 wt % solution, based on total weight of the composition. The solution was filtered through a PTFE micro filter with 0.45 micron pore size to obtain Gap-Fill Composition 3.

Example 6

Solvent Strip Test

Thermal cross-linking reaction of the crosslinkable polymers was indirectly monitored by performing a solvent strip test. Each of the gap-fill compositions from Examples 3-5 was spin-coated on a respective bare Si wafer at 1500 rpm. The coated wafers were baked under a nitrogen environment ($O_2$ level below 100 ppm) at several temperatures for one minute to obtain an initial coating thickness of 130 nm ($t_i$). The films were thoroughly rinsed with a 1:1 PGMEA:HBM (2-hydroxyisobutyric acid methyl ester) solvent mixture to remove non-crosslinked portions of the compositions. The thickness of the insoluble crosslinked composition remaining on the substrate ($t_f$) was measured and thickness loss determined as $(t_i-t_f)/(t_i)$. The results are shown in Table 1.

TABLE 1

| Gap-fill Composition | Polymer | TAG | Temp. (° C.) | Thickness loss (%) |
| --- | --- | --- | --- | --- |
| 3 | P-4 | T-1 | 70 | 97% |
|  |  |  | 90 | 97% |
|  |  |  | 100 | 97% |
|  |  |  | 105 | 92% |
|  |  |  | 110 | 30% |
|  |  |  | 120 | 5% |
|  |  |  | 130 | 2% |
|  |  |  | 150 | 1% |
|  |  |  | 160 | 1% |
|  |  |  | 180 | 1% |

TABLE 1-continued

| Gap-fill Composition | Polymer | TAG | Temp. (° C.) | Thickness loss (%) |
| --- | --- | --- | --- | --- |
|  |  |  | 205 | 1% |
|  |  |  | 215 | 1% |
| 4 | P-2 | T-1 | 70 | 98% |
|  |  |  | 90 | 98% |
|  |  |  | 100 | 97% |
|  |  |  | 105 | 90% |
|  |  |  | 110 | 32% |
|  |  |  | 120 | 8% |
|  |  |  | 130 | 2% |
|  |  |  | 150 | 1% |
|  |  |  | 160 | 1% |
|  |  |  | 180 | 1% |
|  |  |  | 205 | 1% |
|  |  |  | 215 | 1% |
| 5 | P-4 | T-2 | 70 | 99% |
|  |  |  | 90 | 99% |
|  |  |  | 100 | 99% |
|  |  |  | 105 | 99% |
|  |  |  | 110 | 99% |
|  |  |  | 120 | 97% |
|  |  |  | 130 | 97% |
|  |  |  | 150 | 97% |
|  |  |  | 160 | 96% |
|  |  |  | 180 | 39% |
|  |  |  | 205 | 5% |
|  |  |  | 215 | 5% |

Gap-fill compositions 3 and 4 exhibited low thickness loss beginning at 120-130° C., and gap-fill composition 5 exhibited low thickness loss beginning at 205° C. These temperatures are indicative of the onset temperature for crosslinking of the respective polymers, and the low thickness loss is indicative of complete or near complete crosslinking.

Example 7

Gap-Fill Process

Figure 3A:
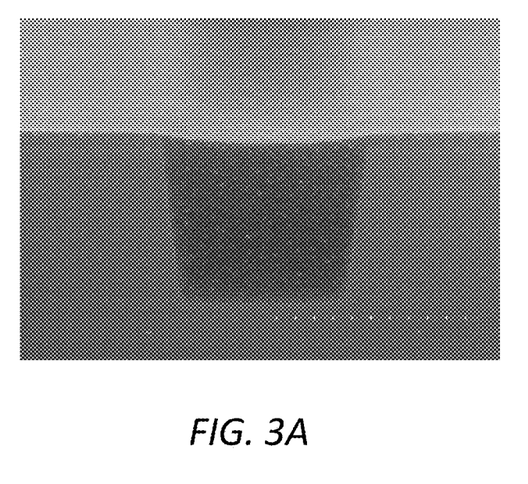
FIG. 3A-B shows SEM photomicrographs of post-filled trench patterns.
Figure 3B:
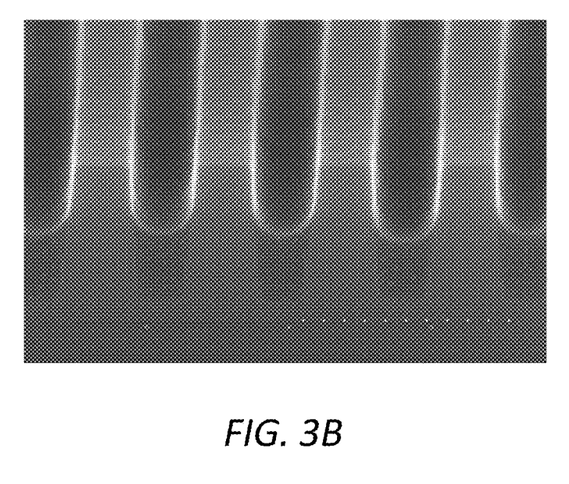

An 8 inch patterned 400 nm LPCVD $SiO_2$ on silicon wafer was provided. The patterns included trenches having a line and space of 300 nm and trenches having a line and space of 150 nm. The gap-fill composition of Example 3 was spin-coated over the patterned surface of the wafer at 1500 rpm to give a film thickness of about 100 nm. The composition was heated on a hotplate at 215° C. for one minute to cause the polymer to crosslink. The trench patterns after crosslinking are shown in the SEM photomicrographs of FIGS. 3A (300 nm 1:1 trench pattern with aspect ratio of 1.33) and 3B (150 nm 1:1 trench pattern with aspect ratio 2.0). The trenches were filled without the formation of voids.

Example 8

Gap-Fill Compositions

Gap-fill compositions are prepared by combining the components in the amounts shown in Table 2. The solutions are filtered through a PTFE filter having a 0.45 micron pore size to provide gap-fill compositions.

TABLE 2

| Gap-fill composition | Polymer | TAG | Crosslinker | Surfactant | Solvent |
|---|---|---|---|---|---|
| 1 | P-1 (6 g) | T-1 (57 mg) | C-1 (1.07 g) | F-1 (3.6 mg) | PGMEA (162.8 g) |
| 2 | P-2 (6 g) | T-1 (57 mg) | C-1 (1.07 g) | F-1 (3.6 mg) | PGMEA (162.8 g) |
| 3 | P-2 (6 g) | T-2 (57 mg) | C-1 (1.07 g) | F-1 (3.6 mg) | PGMEA (162.8 g) |
| 4 | P-3 (6 g) | T-1 (57 mg) | C-1 (1.07 g) | F-1 (3.6 mg) | PGMEA (162.8 g) |
| 5 | P-4 (6 g) | T-1 (57 mg) | C-1 (1.07 g) | F-1 (3.6 mg) | PGMEA (162.8 g) |
| 6 | P-4 (6 g) | T-2 (57 mg) | C-1 (1.07 g) | F-1 (3.6 mg) | PGMEA (162.8 g) |
| 7 | P-4 (6 g) | T-1 (57 mg) | C-2 (1.07 g) | F-1 (3.6 mg) | PGMEA (162.8 g) |
| 8 | P-4 (6 g) | T-1 (57 mg) | C-1 (1.07 g) | F-1 (3.6 mg) | PGMEA (146.5 g)/GBL (16.3 g) |
| 9 | P-5 (6 g) | T-1 (57 mg) | C-1 (1.07 g) | F-1 (3.6 mg) | PGMEA (162.8 g) |
| 10 | P-5 (6 g) | T-2 (57 mg) | C-1 (1.07 g) | F-1 (3.6 mg) | PGMEA (162.8 g) |
| 11 | P-5 (6 g) | T-1 (57 mg) | C-2 (1.07 g) | F-1 (3.6 mg) | PGMEA (162.8 g) |
| 12 | P-5 (6 g) | T-1 (57 mg) | C-1 (1.07 g) | F-1 (3.6 mg) | PGMEA (146.5 g)/GBL (16.3 g) |
| 13 | P-6 (6 g) | T-1 (57 mg) | C-1 (1.07 g) | F-1 (3.6 mg) | PGMEA (162.8 g) |
| 14 | P-6 (6 g) | T-2 (57 mg) | C-1 (1.07 g) | F-1 (3.6 mg) | PGMEA (162.8 g) |
| 15 | P-7 (6 g) | T-1 (57 mg) | C-1 (1.07 g) | F-1 (3.6 mg) | PGMEA (162.8 g) |
| 16 | P-7 (6 g) | T-2 (57 mg) | C-1 (1.07 g) | F-1 (3.6 mg) | PGMEA (162.8 g) |
| 17 | P-8 (6 g) | T-1 (57 mg) | C-1 (1.07 g) | F-1 (3.6 mg) | PGMEA (162.8 g) |
| 18 | P-8 (6 g) | T-2 (57 mg) | C-1 (1.07 g) | F-1 (3.6 mg) | PGMEA (162.8 g) |

PGMEA = propylene glycol monomethyl ether acetate; GBL = gamma-buterolactone; T1 = p-toluenesulfonic acid ammonium salts; T2 = (4-tbutylphenyl)tetramethylenesulfonium (3-hydroxyadamantanyl ester)-tetrafluoro-butanesulfonate); C-1 = tetramethoxymethyl glycouril; C-2 = hexamethylol melamine; and F-1 = fluorochemical surfactant.

Example 9

Figure 4A:
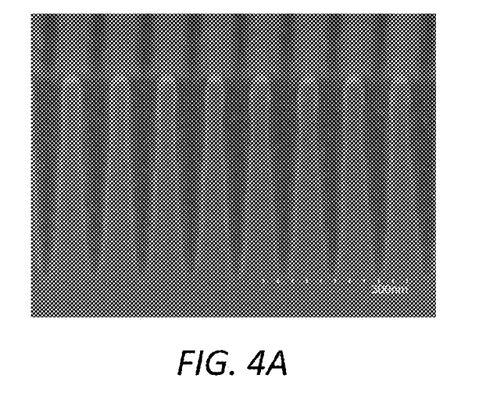
FIG. 4A-D shows SEM photomicrographs of post-filled trench patterns.
Figure 4B:
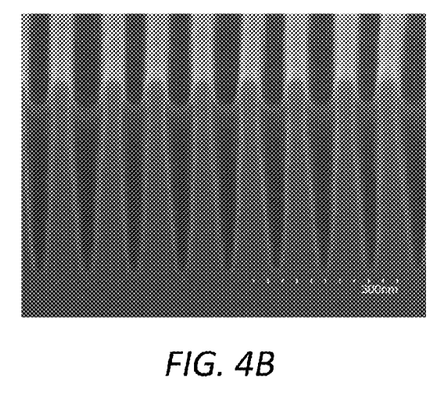
Figure 4C:
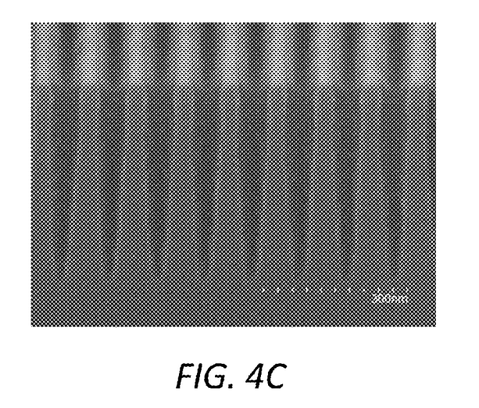
Figure 4D:
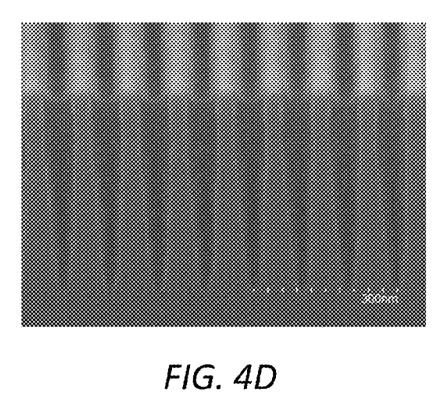

Gap-Fill Process 8-inch silicon wafers with 535 nm thick LPCVD $SiO_2$ patterns were provided. The patterns included trenches having a width of 58 nm at the top of the trench, 20 nm at the bottom of the trench and 45 nm at ½ height of the trench. Gap-fill compositions 2, 5, 9 and 13 were spin-coated over the patterned surface of respective wafers at 1500 rpm to give a film thickness of about 200 nm. The compositions were heated on a hotplate at 215° C. for one minute to cause the polymer to crosslink. Based on visual observation, the trenches were filled with no voids as shown in FIGS. 4A (composition 2), 4B (composition 5), 4C (composition 9) and 4 D (composition 13).

Example 10

Gap-Fill Process

The process described in Example 9 is repeated using gap-fill compositions 1, 3, 4, 6-8, 10-12 and 14-18. It is expected that the trenches would be filled in a void-free manner based on visual observation.

What is claimed is:

1. A gap-fill method, comprising:
(a) providing a semiconductor substrate having a relief image on a surface of the substrate, the relief image comprising a plurality of gaps to be filled;
(b) applying a gap-fill composition over the relief image, wherein the gap-fill composition comprises a non-crosslinked crosslinkable polymer, an acid catalyst, a crosslinker and a solvent, wherein the crosslinkable polymer comprises a first unit of the following general formula (I):

(I)

wherein: $R_1$ is chosen from hydrogen, fluorine, $C_1$-$C_3$ alkyl and $C_1$-$C_3$ fluoroalkyl; and $Ar_1$ is an optionally substituted aryl group that is free of crosslinkable groups; and a second unit of the following general formula (II):

(II)

wherein: $R_3$ is chosen from hydrogen, fluorine, $C_1$-$C_3$ alkyl and $C_1$-$C_3$ fluoroalkyl; and $R_4$ is chosen from optionally substituted $C_1$ to $C_{12}$ linear, branched or cyclic alkyl, and optionally substituted $C_6$ to $C_{15}$ aryl, optionally containing heteroatoms, wherein at least one hydrogen atom is substituted with a functional group independently chosen from hydroxyl, carboxyl, thiol, amine, amide and vinyl groups; and (c) heating the gap-fill composition at a temperature to cause the polymer to crosslink.

2. The method of claim 1, wherein the first unit is chosen from one or more unit chosen from the following formula (I-A), (I-B) and (1-C):

(I-A)

wherein: R₁ is chosen from hydrogen, fluorine, $C_1$-$C_3$ alkyl and $C_1$-$C_3$ fluoroalkyl; R₂ is independently chosen from halogen, nitro, cyano, and optionally substituted $C_1$-$C_{15}$ linear, branched or cyclic alkyl, alkenyl, alkynyl, $C_6$-$C_{18}$ aryl, and combinations thereof, and R₂ is free of crosslinkable groups; a is an integer from 0 to 5; b is an integer from 0 to 7; and c is an integer from 0 to 9.

3. The method of claim 2, wherein the first unit is:

4. The method of claim 1, wherein the second unit is chosen from one or more of the following units:

5. The method of claim 4, wherein the second unit is:

6. The method of claim 1, wherein the crosslinkable polymer consists of the units of general formula (I) and general formula (II).

7. The method of claim 1, wherein the crosslinkable polymer has a weight average molecular weight of greater than 9000.

8. The method of claim 1, wherein the gaps have a width of less than 50 nm and an aspect ratio of 2 or more.

9. The method of claim 1, further comprising prior to causing the gap fill composition to crosslink, heating the gap-fill composition at a temperature to cause the gap-fill composition to fill the plurality of gaps.

10. The method of claim 9, wherein the heating to fill the plurality of gaps and the heating to crosslink are conducted in a single process.

11. A gap-fill method, comprising:
(a) providing a semiconductor substrate having a relief image on a surface of the substrate, the relief image comprising a plurality of gaps to be filled;
(b) applying a gap-fill composition over the relief image, wherein the gap-fill composition comprises a non-crosslinked crosslinkable polymer, an acid catalyst, a crosslinker and a solvent, wherein the crosslinkable polymer comprises a first unit of the following general formula (I):

(I)

wherein: $R_1$ is chosen from hydrogen, fluorine, $C_1$-$C_3$ alkyl and $C_1$-$C_3$ fluoroalkyl; and $Ar_1$ is an optionally substituted aryl group that is free of crosslinkable groups; and a second unit chosen from the following:

and

(c) heating the gap-fill composition at a temperature to cause the polymer to crosslink.

12. The method of claim 11, wherein the first unit is chosen from one or more unit chosen from the following formula (I-A), (I-B) and (1-C):

wherein: $R_1$ is chosen from hydrogen, fluorine, $C_1$-$C_3$ alkyl and $C_1$-$C_3$ fluoroalkyl; $R_2$ is independently chosen from halogen, nitro, cyano, and optionally substituted $C_1$-$C_{15}$ linear, branched or cyclic alkyl, alkenyl, alkynyl, $C_6$-$C_{18}$ aryl, and combinations thereof, and $R_2$ is free of crosslinkable groups; a is an integer from 0 to 5; b is an integer from 0 to 7; and c is an integer from 0 to 9.

13. The method of claim 12, wherein the first unit is:

14. The method of claim 11, wherein the crosslinkable polymer consists of the units of general formula (I) and of the second unit.

15. The method of claim 11, wherein the crosslinkable polymer has a weight average molecular weight of greater than 9000.

16. The method of claim 11, wherein the gaps have a width of less than 50 nm and an aspect ratio of 2 or more.

17. The method of claim 11, further comprising prior to causing the gap fill composition to crosslink, heating the gap-fill composition at a temperature to cause the gap-fill composition to fill the plurality of gaps.

18. The method of claim 17, wherein the heating to fill the plurality of gaps and the heating to crosslink are conducted in a single process.

* * * * *